United States Patent [19]
Sato

[11] 3,966,473
[45] June 29, 1976

[54] METHOD FOR PRODUCING A PHOTOMASK
[75] Inventor: Masamichi Sato, Asaka, Japan
[73] Assignee: Fuji Photo Film Co., Ltd., Minami-ashigara, Japan
[22] Filed: Oct. 9, 1974
[21] Appl. No.: 513,435

[30] Foreign Application Priority Data
Oct. 9, 1973   Japan.............................. 48-113630

[52] U.S. Cl................................... 96/36; 96/38.3; 156/13; 156/15; 252/79.3; 355/125; 355/133
[51] Int. Cl.² ..................... G03C 5/00; C09K 13/08; C23F 1/02; G03B 27/00
[58] Field of Search............ 96/38.3, 36.2, 36, 60 R; 156/13, 15; 355/125, 132, 133; 252/79.3

[56] References Cited
UNITED STATES PATENTS

| 3,474,021 | 10/1969 | Davidse et al. ...................... 156/8 X |
| 3,561,963 | 2/1971 | Kiba .............................. 96/38.3 UX |
| 3,567,446 | 3/1971 | Gleadle ................................... 96/36 |
| 3,669,665 | 6/1972 | Faigenbaum et al. ........... 96/36.2 X |
| 3,674,492 | 7/1972 | Goldrick et al. ................. 96/38.3 X |
| 3,744,904 | 7/1973 | Loprest et al. ................. 96/38.3 UX |
| 3,754,913 | 8/1973 | Takeuchi et al. ..................... 96/38.3 |
| 3,765,901 | 10/1973 | Schellekens ..................... 96/36.2 X |

Primary Examiner—William A. Powell
Assistant Examiner—Thomas Bokan
Attorney, Agent, or Firm—Sughrue, Rothwell, Mion, Zinn & Macpeak

[57] ABSTRACT

A method for producing a photomask by exposing and development-processing a photographic light-sensitive material including a transparent support having thereon a masking layer and a silver halide emulsion layer to thereby form silver image areas, etch-bleaching the silver halide emulsion layer to thereby remove the silver image areas to uncover the masking layer thereunder, subjecting the coated support to etching to etch the uncovered masking layer with a mixed solution containing hydrofluoric acid and ammonium fluoride to thereby uncover the transparent support thereunder, and then removing the non-silver image areas to thereby reveal the masking layer.

14 Claims, 5 Drawing Figures

METHOD FOR PRODUCING A PHOTOMASK

BACKGROUND OF THE INVENTION

1. Field of the Invention

The present invention relates to a method for producing a photomask and, more particularly, it relates to a method for easily producing a photomask having good quality using a silver halide photographic material.

2. Description of the Prior Art

It is known in the field of printed circuit fabrication or microelectronic fabrication to use a photomask in the case of forming images utilizing a photoresist method. Heretofore, photomasks have often utilized silver images or chromium images. Silver images are obtained by imagewise exposing a photographic light-sensitive material (a so-called emulsion mask) provided on a glass plate, followed by ordinary photographic processings (e.g., development and fixing). On the other hand, chromium images are formed by providing a vacuum-deposited chromium layer on a glass support and etching the chromium layer using the photo etching method. That is, a photoresist is coated on the chromium layer and, after exposing through a photomask superposed thereon (contact method) or after projecting a photomask on the photoresist (projection method), the photoresist is development-processed to form a resist image, followed by etching the chromium layer.

Since an emulsion mask has high sensitivity, it is suitable for preparing a photomask. However, the resolving power of a photo mask obtained is inferior to that of a chromium mask using the projection method due to scattering of light by the silver grains, the high thickness of the silver halide emulsion layer and the silver particles after development. A photomask utilizing silver images is inferior in resolving power for the following additional reason. That is, since the developed emulsion thickness is larger at silver image areas than at non-image areas, gaps or spaces are formed at the contact surfaces upon intimately contacting the photomask with the photoresist layer in order to form a resist image, thus markedly reducing the resolving power. In addition, a photomask formed using a silver image has such a small mechanical strength that it is easily damaged. Also, since the silver image does not transmit visible light, positioning of the mask is difficult.

On the other hand, a chromium mask using a contact method is inferior to a photomask obtained with a silver image in resolving power, since the chromium mask suffers reduction in resolving power upon exposing a photoresist layer and upon etching the vacuum-deposited chromium layer. Also, with a chromium mask using a projection method, the photoresist layer has such a low sensitivity that exposure requires too much time, thus it is difficult to practice industrially.

SUMMARY OF THE INVENTION

It is, therefore, an object of the present invention to provide a method for producing a photomask having high sensitivity, high resolving power and excellent durability.

Another object of the present invention is to provide a method for producing a photomask without using a photoresist process.

The above-described objects of the present invention can be attained by exposing and development-processing a photographic material comprising a transparent support having thereon a masking layer and a silver halide emulsion layer to thereby form a silver image, etch-bleaching the silver halide emulsion layer to thereby remove the silver image areas to uncover the masking layer thereunder, etching the uncovered areas of the masking layer with a mixture containing hydrofluoric acid and ammonium fluoride to uncover the transparent support thereunder, and removing the non-silver image areas to leave the etched masking layer thereon.

Figure 1:
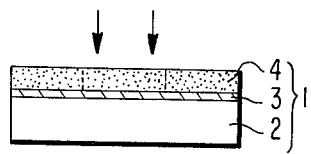
FIGS. 1 through 5 are illustrations showing one embodiment of the present invention.

In each figure, numeral 1 designates a photographic light-sensitive material, 2 a transparent support, 3 a masking layer, 4 a silver halide emulsion layer, 4a silver image areas, 4b non-silver image areas (binder layer), 3a a masking layer corresponding to the silver image areas, and 2a a transparent support surface corresponding to the silver image areas.

DETAILED DESCRIPTION OF THE INVENTION

The photographic material used in the present invention fundamentally comprises a transparent support having thereon a masking layer and a silver halide emulsion layer.

Suitable transparent supports include a glass plate, quartz, sapphire, plastic films (e.g., a cellulose acetate film, a cellulose nitrate film, a polyethylene terephthalate film, a polystyrene film, etc.), and the like.

The support must be transparent since it is a necessary condition for mask-positioning as is well known in the ordinary photo mask art. However, the transparent support is not particularly limited in the present invention with respect to its other characteristics.

The masking layer is provided by depositing a masking material on a transparent support by vacuum deposition, sputtering, ion plating or the like. Suitable masking materials are silicon dioxide, glass (containing $SiO_2$), titanium, and the like. It is desirable to incorporate impurities in the silicon dioxide or glass. The impurities impart the property to the masking material of transmitting well light of a wavelength not less than 450 m$\mu$ while well absorbing light having a shorter wavelength. Examples of impurities are silver, iron, cadmium, chromium, sulfur, selenium, iron oxide, chromium oxide, copper oxide, etc. These impurities can be incorporated in the silver dioxide or glass masking layer by sputtering, heat diffusion or the like. The amount of impurities incorporated into the silicon dioxide or glass is such that the masking layer can provide a transmission of less than about 10% for light of a wavelength at 450 nm (nanometers). The masking material provides a masking effect with respect to light and is preferably selected from those which transmit visible light and absorb ultraviolet light. Suitable masking materials which can be used in the present invention are any materials which can be dissolved with a mixture of hydrofluoric acid and ammonium fluoride.

The thickness of the masking layer cannot definitely be specified since it varies depending upon the end-use thereof. However, in general, a range of from about 0.5 $\mu$ to 3 $\mu$ is employed. If the layer is too thin, absorption of ultraviolet light is too small, while, if the layer is too thick, etching takes a long time. Since a metal or a metal oxide possesses a much greater mechanical strength as compared with a photographic emulsion layer or the like, a metal or a metal oxide renders the photomask scratch resistant.

The silver halide emulsion can be coated directly on the masking layer or on a subbing layer on the masking layer. The subbing layer which can be used in the present invention is a layer which intimately adheres to both the masking layer and the silver halide emulsion layer. Where the masking layer is extremely different in property from the silver halide emulsion layer, two or more subbing layers can be employed. More specifically, those subbing layers described in Japanese Patent Publication Nos. 5509/64, 2597/69, 11616/71, U.S. Pat. No. 3,492,122, West German OLS No. 2,001,727, etc., are suitable. Also, a subbing layer formed by providing a thin polyvinyl acetate layer (for example, a thickness of about 0.1 to 0.3 micron) and bringing the surface into contact with an alkaline aqueous solution such as an aqueous solution of sodium hydroxide for saponification can be used. A suitable thickness for the subbing layer can range from about 0.1 to 0.5 micron.

The silver halide emulsion coated on the masking or subbing layer can be obtained by dispersing silver halide in an water-soluble binder. Illustrative silver halides are silver chloride, silver bromide, silver iodide, silver chlorobromide, silver bromoiodide, silver chlorobromoiodide, etc. A most typical silver halide emulsion is an emulsion which contains about 90 mol% or more silver bromide (preferably containing not more than about 5 mol% silver iodide) and contains silver halide having a mean grain size of not more than about 0.1 $\mu$ (a so-called Lippmann emulsion), and in which the weight ratio of the silver halide to the water-soluble binder is about 1 : 4 to about 6 : 1. Another example of a silver halide emulsion is an emulsion which contains about 50 mol% or more (preferably 70 mol% or more) silver chloride and contains silver halide having a mean grain size of not more than about 1.0 $\mu$.

On the other hand, typical water-soluble binders, e.g., gelatin, colloidal albumin, casein, cellulose derivatives (e.g., carboxymethyl cellulose, hydroxyethyl cellulose, etc.), sacchride derivatives (e.g., agar-agar, sodium alginate, starch derivatives, etc.), synthetic hydrophilic collids (e.g., polyvinyl alcohol, poly-N-vinyl pyrrolidone, polyacrylic acid copolymers, polyacrylamide, a derivative thereof, etc.) can be used. If desired, a compatible mixture of two or more of these binders can be used. Of these, the most preferred binder is gelatin. Gelatin can be replaced, partly or completely, by a synthetic high molecular weight substance, by a so-called gelatin derivative (prepared by reacting gelatin with a compound containing a group capable of reacting with the functional groups contained in the gelatin molecule (i.e., amino groups, imino groups, hydroxy groups or carboxy groups)), or by a graft polymer prepared by grafting a molecular chain of another high molecular weight substance to the gelatin molecule. Illustrative compounds for preparing gelatin derivatives are, e.g., isocyanates, acid chlorides and acid anhydrides as described in U.S. Pat. No. 2,614,928, acid anhydrides as described in U.S. Pat. No. 3,118,766, bromoacetic acid as described in Japanese Patent Publication No. 5514/64, phenyl glycidyl eters as described in Japanese Patent Publication No. 21845/67, vinyl sulfone compounds as described in U.S. Pat. No. 3,132,945, N-allylvinylsulfonamides as described in British Patent 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Patent Publication No. 26845/67, acid esters as described in U.S. Pat. No. 2,763,639, alkanesultones as described in British Patent 1,033,189, and the like. High polymers chains to be grafted to the gelatin are described in U.S. Pat. Nos. 2,763,625, 2,831,767, 2,956,884, *Polymer Letters*, 5, 595 (1967), *Phot. Sci. End.*, 9, 148 (1965), *J. Polymer Sci. A-1*, 9, 3199 (1971), and the like. Homopolymers or copolymers of those compounds which are generally called vinyl monomers, such as acrylic acid, methacrylic acid, the ester, amide, and nitrile derivatives thereof, styrene, etc. can be widely used. However, hydrophilic vinyl polymers having some compatibility with gelatin, such as the homopolymers or copolymers of acrylic acid, acrylamide, methacrylamide, hydroxyalkyl acrylate, hydroxyalkyl methacrylate, etc. are particularly preferred.

These emulsions can be advantageously optically sensitized with known optical sensitizer such as the cyanine dyes and merocyanine dyes as described in U.S. Pat. Nos. 1,346,301, 1,846,302, 1,942,854, 1,990.,507, 2,493,747, 2,739,964, 2,493,748, 2,503,776, 2,519,001, 2,666,761, 2,734,900, 2,739,149, and British Patent 450,958.

Suitable exposures of the silver halide emulsion can be to electromagnetic radiation, to which the silver halide emulsion is sensitive, e.g., visible, ultraviolet, electron beams, X-ray, etc. With the optically sensitized photographic light-sensitive materials, it is convenient to select light mainly of a wavelength corresponding to optically sensitized region of the emulsion as the light for exposing the emulsion layer.

The emulsion is advantageously chemically sensitized with salts of noble metals such as ruthenium, rhodium, palladium, iridium, platinum, etc. as described in U.S. Pat. Nos. 2,448,060, 2,566,245 and 2,566,263. Also, as is described in U.S. Pat. No. 2,339,083, the emulsion can be chemically sensitized with a gold salt or, as is described in U.S. Pat. Nos. 2,597,856 and 2,597,915, the emulsion can be stabilized with a gold metal. Furthermore, a thiopolymer as described in U.S. Pat. No. 3,046,129 can advantageously be incorporated in the emulsion. In addition, the emulsion can be stabilized with mercury compounds described in U.S. Pat. No. 3,046,129, column 20, line 51 to column 21, line 3, triazoles, azaindenes, disulfides, quaternary benzothiazollium compounds, zinc salts and cadmium salts.

The emulsion can contain light-absorbing dyes as described in U.S. Pat. Nos. 2,527,583, 2,611,696, 3,247,127, 3,260,601, etc.

The emulsion can be advantageously hardened with a suitable hardening agent for a hydrophilic colloid, such as formaldehyde or a like hardener; N-methylol compounds as described in U.S. Pat. Nos. 2,732,316 and 2,586,168, carbodiimide compounds as described in U.S. Pat. No. 3,100,704, epoxy compounds as described in U.S. Pat. No. 3,091,527, halogen-substituted fatty acids (e.g., mucobromic acid, etc.); compounds having many acid anhydride groups; methanesulfonic acid bisester; dialdehydes or a sodium bisulfite adduct thereof such as $\beta$-methylglutaraldehyde bissodium bisulfite adduct; bisaziridinecarboxamide (e.g., trimethylenebis(1-aziridinecarboxamide); triazine derivatives (e.g., 2-hydroxy-4,6-dichloro-s-triazine, etc.); and the like.

The silver halide emulsion is coated on a masking layer or after adding a coating aid as described in U.S. Pat. No. 3,046,129. The silver halide emulsion layer can be suitably coated in an thickness above about 0.3 μm and preferably has a thickness of less than about 10 μ and can be coated as in one or more layers on the masking layer.

If desired, a backing layer, an anti-halation layer, an interlayer, an uppermost layer (e.g., a protective layer, etc.), and the like, can be provided on the support, the masking layer or on the emulsion layer. In particular, when glass is used as a support, in some cases it is useful to provide a backing layer since the back side (opposite to the emulsion-coated layer) is sometimes subjected to etching.

Formation of a silver image in the silver halide emulsion layer can be effected using ordinary photographic processings, that is, by development-processing the exposed emulsion layer and, if necessary, fixing. Conventional processings including exposure, development, fixing, etc. are described in detail, e.g., in Kodak Data Book P-52, "Techniques of Microphotography" (1970, Rochester, N.Y.).

Suitable developing agents which can be used in the method of the present invention for forming silver images are those well known in the art, such as the dihydroxybenzenes (e.g., hydroquinone, chlorohydroquinone, bromohydroquinone, isopropylhydroquinone, toluhydroquinone, methylhydroquinone, 2,3-dichlorohydroquinone, 2,5-dimethylhydroquinone, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-2-pyrazolidene,1-phenyl-5-methyl-3-pyrazolidone, etc.), the aminophenols (e.g., o-aminophenol, p-aminophenol, N-methyl-o-aminophenol, N-methyl-p-aminophenol, 2,4-diaminophenol, etc.), pyrogallol, ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), and mixtures thereof. The developer generally possesses a pH of not less than about 8, preferably about 8.5 to 12.5.

The developer can contain, if desired, a preservative (e.g., a sulfite, a bisulfite, etc.), a buffer (e.g., a carbonate, boric acid, a borate, an alkanolamine, etc.), a dissolving aid (e.g., a polyethylene glycol, etc.), a pH-adjusting agent (e.g., acetic acid or a like organic acid, etc.), a sensitizing agent (e.g., a quaternary ammonium salt, etc.), a development accelerator, a surface active agent, etc.

Suitable fixing agents for silver halide are the generally well known solvents for silver halide, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble, sulfur-containing organic dibasic acid (e.g., ethylenebisthioglycolic acid, etc., a water-soluble salt thereof (e.g., sodium ethylenebisthioglycolate, potassium ethylenbisthioglycolate)), and a mixture thereof.

The fixing agent-containing solution can contain, if desired, a preservative (e.g., a sulfite a bisulfite, etc.), a pH-buffer (e.g., boric acid, a borate, etc.), a pH-adjusting agent (e.g., acetic acid, etc.), a chelating agent, and the like.

Thus, a silver image is formed in the exposed areas. In the unexposed areas, silver halide still remains or is removed through fixation, while the binder in the silver halide emulsion layer remains intact. Where a silver halide emulsion is a reversal type emulsion or where reversal processing is conducted, the binder layer remains in the exposed areas, whereas a silver image is formed in the unexposed areas. The silver image formed at this stage is so poor in mechanical strength that it is difficult to use the silver image many times as a photomask. Additionally, the non-silver image areas as used herein in this specification means the areas of the silver halide emulsion layer other than the silver image areas. Thus, the terms "silver image areas" and "non-silver image areas" do not necessarily designate exposed areas and unexposed areas, respectively.

Then, the photographic material in which the silver image is formed is etch-bleached. Etch-bleaching means the phenomenon that, when the silver image-containing layer is processed with an etch-bleaching solution, the silver image areas are removed from the layer together with the binder. The composition of the etch-bleaching solution can be appropriately selected from those solutions which have already been known. For example, suitable compositions are a composition comprising cupric chloride, citric acid and an aqueous solution of hydrogen peroxide; a composition comprising cupric nitrate, potassium bromide, lactic acid and an aqueous solution of hydrogen peroxide; a composition comprising ferric nitrate, potassium bromide, lactic acid and an aqueous solution of hydrogen peroxide; and the like. Suitable etching-bleaching solutions which can be used are described further in TAGA Proceedings pp 1–11, 1967 and PSA Technical Quarterly, Nov. 1955 pp 130–134. Since the completion of etch-bleaching processing is recognizable by the complete disappearance of the silver image, it is not necessary to designate a particular processing time. Generally, the processing time ranges from about 2 to 10 minutes at about 15° to 50°C, preferably 20° to 30°C. The silver image is removed with the etch-bleaching solution to uncover the masking surface thereunder. On the other hand, the non-silver image areas (binder layer) remain intact without being etched. Therefore, the masking layer under the binder layer does not change at all.

Then, the thus uncovered masking layer is etched with a mixture containing hydrofluoric acid and ammonium fluoride. In this occasion, what is important is that the binder layer functions as the resist for the masking layer lying under the binder layer. That is, the significance of the method of the present invention is that the mixture of hydrofluoric acid and ammonium fluoride does not etch the binder and that the binder does not permit the etching solution to permeate therethrough. Such a phenomenon is also experienced with a baked binder layer. That is, when the binder layer is heated to above about 150°C, preferably 300° to 500°C, after silver image formation and before etching, in particular, before etching with an etch-bleaching solution, the sharpness of the mask image ultimately obtained is improved. The thus baked binder layer is not etched with a mixture of hydrofluoric acid and ammonium fluoride.

It is more preferable to use, as an etching solution, hydrofluoric acid and ammonium fluoride as a mixture or by combining individual solutions thereof with each other than to use them individually. Because, when hydrofluoric acid is used alone, the binder layer is sometimes removed in the etching step, while, when ammonium fluoride is used alone, the etching rate is reduced. For this reason, a mixture of 1 volume of 46% by weight hydrofluoric acid and about 0.5 to 20 volumes of a 40% by weight ammonium fluoride or a solution prepared by diluting this mixture with water, e.g., to a concentration ranging from ⅛ to ¼ the original concentration, is preferred. However, use of a mixture wherein the proportion is outside the above-described range is possible in the present invention since removal of the binder layer can be prevented by immersing the material, after etching with a hydrofluoric acid-ammonium fluoride mixture in which the proportion of ammonium fluoride is less than the above-described range and before washing with water, in an ammonium fluoride solution alone. Also, a dried binder layer would not be removed even when etched with a mixture solution containing less ammonium fluoride. In addition, disregarding the etching rate, a mixture containing ammonium fluoride in a greater proportion is employable. In other words, the amount of hydrofluoric acid in the etching solution is satisfactorily determined so that the binder is not removed. Other ingredients such as a buffer (e.g., acetic acid, etc.) can be incorporated in the etching solution.

The remaining binder layer is removed by swelling or dissolving the layer. Removal can be effected by using an alkali (e.g., using an aqueous solution of sodium hydroxide of a concentration of about 10 to 20% by weight at about 40° to 60°C for about 2 to 10 minutes). An aqueous solution of potassium hydroxide of a concentration of about 10 to 20% by weight for about 2 to 5 minutes, etc., sodium hypochlorite (e.g., using concentration of aabout 10 to 20% by weight at about 30° to 60°C for about 1 to 5 minutes) or an acid (e.g., using 15% hydrochloric acid, using concentrated (98%) sulfuric acid at about 60° to 95°C for about 5 to 10 minutes, concentrated nitric acid at about 50° to 98°C for about 2 to 10 minutes, etc.). According to this method, a positive-positive mask image is obtained. However, when a reversal emulsion and/or a reversal processing is employed, a negative-positive mask image is obtained.

The present invention will now be illustrated in more detail by reference to the accompanying drawings.

FIGS. 1 through 5 schematically illustrate an embodiment of the method of the present invention by which a photo mask is produced.

In FIG. 1, photographic light-sensitive material 1 comprises transparent support 2 having thereon masking layer 3 and silver halide emulsion layer 4. When photographic light-sensitive material 1 is exposed in the direction indicated by the arrows and then development-processed and fixed, silver image areas 4a and binder layer (non-silver image areas) 4b are formed as illustrated in FIG. 2.

Figure 2:
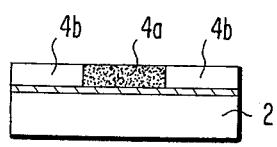
Figure 3:
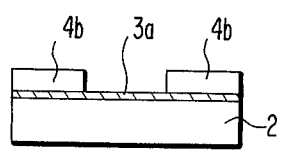
Figure 4:
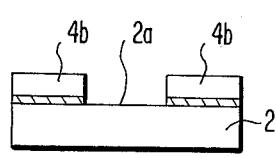
Figure 5:
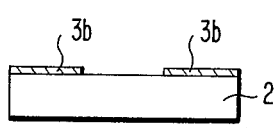

The silver image areas 4a shown in FIG. 2 are etch-bleached to reveal masking layer 3a (FIG. 3). Further, masking layer 3a is etched away to reveal transparent support 2a (FIG. 4). The binder layer (non-silver image areas) 4b is then removed to form a photomask (FIG. 5).

According to the method of the present invention, a photo mask can be produced without using the photo-resist method. The steps are thus simplified.

In addition, the resulting photomask possesses high resolving power, high sensitivity and markedly improved durability.

In the present invention, the optical density of silver image need not be different from that achieved in conventional silver halide photography. The silver image functions only as a medium for converting an emulsion layer to a resist image corresponding to an original image. That is, in conventional photography, the optical density of silver image becomes small, as the thickness of the emulsion layer is reduced, to such an extent that it is not practically usable, while, in the present invention, the thickness of the emulsion layer is such that the emulsion layer is removed according to original image to form a resist image of the emulsion layer. Therefore, a film thickness as thin as about 1/15 that necessary for obtaining sufficient optical density using a conventional photographic emulsion is employable (provided that the proportion of silver in the emulsion is the same). The thinness of the emulsion layer provides the following advantages, and the resulting image is more excellent than that obtained by conventional photography. A first advantage is that the thinness serves to reduce the scattering of light by the silver halide grains in the emulsion layer, thus improving the resolving power. A second advantage is that the thinness ensures the ability to achieve good focus upon projecting the image on an emulsion layer through a lens. That is, in an optical system to obtain a resolving power of 500 to 1000 lines/mm, the focal depth is around 5 $\mu$, and hence the thickness of the emulsion is desirably much less than this. However, a conventional silver halide photographic emulsion has a thickness of 5 $\mu$ or greater. A third advantage is that the thinness serves to reduce the reduction in resolving power due to halation. A fourth advantage is that, in the case of conducting etch-bleaching or a like chemical processing or baking, the thinness serves to improve the resolving power. A fifth advantage is that less silver is used.

The following examples are given to illustrate the invention in greater detail. Unless otherwise indicated all parts, percents, ratios and the like are by weight.

EXAMPLE 1

Silicon dioxide and silver were simultaneously adhered onto a glass plate by high frequency sputtering to form a yellow masking layer of a thickness of about 0.25 $\mu$. The resulting masking layer well absorbed light having a wavelength longer than 450 m$\mu$ (millimicrons) and possessed a mechanical strength almost as strong as that of quartz. The surface reflection of the masking layer was almost as high as that of glass.

1400 ml of a silver bromide emulsion (mean grain size of silver bromide: about 0.06 $\mu$) was prepared using 50 g of gelatin and 188 g of silver bromide. To this emulsion was added 0.25 g of 4-methyl-2,3-diethoxathiazolocarbocyanine iodide, to optically sensitize the emulsion to light of a wavelength of 510 m$\mu$ – 530 m$\mu$. Then, this emulsion was coated, in a thickness of about 3 $\mu$, on the above-described masking layer provided on the glass plate and dried to thereby obtain a photographic light-sensitive material. This photographic light-sensitive material was imagewise exposed, development-processed in a developer having the following composition (24°C, 5 min), and fixed with a fixing solution (24°C, 1 min) to obtain a silver image.

| Developer | | |
|---|---|---|
| 1-Phenyl-3-pyrazolidone | 0.5 | g |
| Sodium Sulfite | 50 | g |
| Hydroquinone | 12 | g |
| Sodium Carbonate (monohydrate) | 60 | g |
| Potassium Bromide | 2 | g |
| Benzotriazole | 0.2 | g |
| 1-Phenyl-5-mercaptotetrazole | 5 | mg |
| Phenazine-2-carboxylic Acid | 1 | g |
| Water to make | 1 | liter |
| Fixing Solution | | |
| 70% Aqueous Solution of Ammonium Thiosulfate | 200 | cc |
| Sodium Sulfite | 15 | g |
| Boric Acid | 8 | g |
| Glacial Acetic Acid | 16 | cc |
| Aluminum Sulfate | 10 | g |
| Aulfuric Acid | 2 | cc |
| Water to make | 1 | liter |

Furthermore, the photographic material was immersed for 2 minutes at 20°C in an etch-bleaching solution having the following composition, washed with water and dried. The silver image areas were removed through this processing.

| Etch-Bleaching Solution | | |
|---|---|---|
| Solution A: | Cupric Chloride | 10 g/liter |
| | Citric Acid | 10 g/liter |
| Solution B: | 3% Aqueous Solution of hydrogen peroxide | |

(Upon use, Solution A and Solution B were mixed with each other in a volume ratio of 1:1 to prepare an etch-bleaching solution.)

Then, when the photographic material was immersed for about 25 seconds in a mixture of 1 volume of hydrofluoric acid (46%) and 4 volumes of ammonium fluoride (40%), the masking layer was completely etched at the areas corresponding to the silver image areas. After further washing with water, the photographic material was immersed in a 20% sodium hydroxide aqueous solution to remove the gelatin layer at the non-silver image areas. Thus, a photomask having a high resolving power and excellent sharpness was obtained.

EXAMPLE 2

In a manner analogous to Example 1 except for using iron as an impurity in place of silver, an excellent photo mask was similarly obtained.

EXAMPLE 3

In a manner analogous to Example 1 except for using a soda-lime glass as a masking material in place of the silicon dioxide, the same results were obtained.

EXAMPLE 4

The same procedures as described in Example 1 were conducted except for vacuum-depositing titanium on a glass plate in a thickness of about 0.1 $\mu$ and using the following composition as an etching solution. The etching time was 40 seconds.

| 46% Hydrofluoric Acid | 1 volume |
|---|---|
| 40% Ammonium Fluoride | 8 volumes |

Substantially the same results as obtained in Example 1 were obtained.

EXAMPLE 5

The same procedures as described in Example 2 were conducted except for heating the gelatin layer, after etch-bleaching, for 4 minutes at 400°C in air. Substantially the same results as obtained in Example 1 were obtained.

EXAMPLE 6

A solid electrolyte powder ($Ag_6I_4WO_4$) was spread on a glass plate (in a thickness of about 1 mm). When the glass plate was heated, the powder was melted at 300°C. This molten salt was uniformly spread on the glass plate and, after leaving for 7 minutes at 500°C, the coated plate was allowed to cool. When the temperature was decreased to room temperature (about 20° to 30°C) the molten salt solidified on the glass plate was dissolved away by immersion in an aqueous solution of sodium thiosulfate. The thin surface layer on the glass plate was colored orange. This may be attributed to the heat diffusion of silver from the above-described substance. This colored layer well absorbed light having wave-lengths shorter than 400 m$\mu$ and well transmitted light having wave-lengths longer than 400 m$\mu$.

On this layer was provided a silver halide emulsion layer as in Example 1 and subsequent procedures were conducted in the same manner as in Example 1. Substantially the same results as obtained in Example 1 were obtained.

EXAMPLE 7

The same procedures as described in Example 1 were conducted except for etch-bleaching without fixing. Substantially the same results as obtained in Example 1 were obtained.

EXAMPLE 8

The same procedures as described in Example 1 were conducted except for using as an etching solution a mixed solution comprising 1 volume of hydrofluoric acid (46%), 4 volumes of ammonium fluoride (40%) and 1 volume of glacial acetic acid. Substantially the same results as obtained in Example 1 were obtained.

EXAMPLE 9

The same procedures as described in Example 1 were conducted except for adjusting the thickness of the emulsion layer to 0.6 $\mu$. Thus, an image having a higher resolving power than in Example 1 was obtained, i.g., 2 $\mu$m lines with a smooth edge and high contrast.

While the invention has been described in detail and with reference to specific embodiments thereof, it will be apparent to one skilled in the art that various changes and modifications can be made therein without departing from the spirit and scope thereof.

What is claimed is:

1. A method for producing a photomask, which comprises exposing and development-processing a photographic light-sensitive material consisting essentially of a transparent support having thereon a masking layer and a silver halide emulsion layer to thereby form silver image areas, said emulsion layer being formed by dispersing silver halide in a water soluble binder, etch-bleaching said silver halide emulsion layer to thereby remove the silver image areas to uncover the masking layer thereunder, subjecting the support, masking layer and remaining non-silver image areas of the emulsion layer to etching to etch the uncovered masking layer with a mixed solution containing hydrofluoric acid and ammonium fluoride to thereby uncover the transparent support thereunder without permeation of the mixed solution etchant through the non-silver image areas of the emulsion layer, and then removing the non-silver image areas of the emulsion layer to thereby reveal the masking layer.

2. The method of claim 1, wherein said support is a glass plate, quartz, sapphire, or a synthetic resin film.

3. The method of claim 1, wherein said masking layer is a layer of a material which transmits visible light and absorbs ultraviolet light and which can be dissolved with a mixture of hydrofluoric acid and ammonium fluoride.

4. The method of claim 3, wherein said masking layer is a layer of silicon dioxide, a glass containing silicon dioxide, or titanium.

5. The method of claim 4, wherein said layer of silicon dioxide or glass containing silicon dioxide contains silver, iron, cadmium, chromium, sulfur, selenium, iron oxide, chromium oxide, or copper oxide as an impurity, whereby the silicon dioxide and the glass containing silicon dioxide transmits well light of a wavelength not less than about 450 nm and well absorbs light having a wavelength shorter than 450 nm.

6. The method of claim 1, wherein said masking layer has a thickness ranging from about 0.05 micron to 3 microns.

7. The method of claim 1, wherein said silver halide emulsion layer is an emulsion layer of silver chloride, silver bromide, silver iodide, silver chlorobromide, silver bromoiodide, or silver chlorobromoiodide.

8. The method of claim 7, wherein said silver halide emulsion is an emulsion containing about 90 mole % or higher silver bromide and not more than about 5 mole % silver iodide and the mean grain size of the silver halide grains is not more than about 0.1 micron and wherein the weight ratio of the silver halide to the water-soluble binder of the emulsion is about 1:4 to about 6:1.

9. The method of claim 7, wherein said silver halide emulsion is an emulsion which contains about 50 mole % or higher silver chloride and contains silver halide grains having a mean grain size of not more than about 1 micron.

10. The method of claim 1, wherein said silver halide emulsion layer has a thickness of less than about 10 microns.

11. The method of claim 1, wherein said etch-bleaching of said silver halide emulsion layer is at a temperature of about 15°C to 50°C.

12. The method of claim 1, wherein said etch-bleaching is with a composition containing cupric chloride, citric acid and hydrogen peroxide; a composition containing cupric nitrate, potassium bromide, lactic acid and hydrogen peroxide; or a composition containing ferric nitrate, potassium bromide, lactic acid and hydrogen peroxide.

13. The method of claim 1, wherein said etching of the masking layer is with an aqueous solution containing hydrofluoric acid and ammonium fluoride comprising one volume of 46% by weight hydrofluoric acid and about 0.5 to 20 volumes of a 40% by weight ammonium fluoride.

14. The method of claim 1, wherein the removing of the non-silver image areas is by removing the binder layer remaining using an alkali solution, a hypochlorite solution or an acid solution.

* * * * *